(12) United States Patent
Lem et al.

(10) Patent No.: US 6,215,063 B1
(45) Date of Patent: Apr. 10, 2001

(54) RADIO FREQUENCY COMPONENT AND METHOD OF MAKING SAME

(75) Inventors: Rafael G. Lem; Luis W. Lopez, both of Chula Vista, CA (US)

(73) Assignee: Baier & Baier, Inc., San Juan Capistrano, CA (US)

( * ) Notice: Subject to any disclaimer, the term of this patent is extended or adjusted under 35 U.S.C. 154(b) by 0 days.

(21) Appl. No.: 09/217,153

(22) Filed: Dec. 21, 1998

(51) Int. Cl.$^7$ ........................................... H05K 5/06
(52) U.S. Cl. ..................... 174/52.3; 361/753; 174/51
(58) Field of Search ................... 174/52.3, 52.4, 174/35 R, 51; 361/816, 818, 752, 753

(56) References Cited

U.S. PATENT DOCUMENTS 4,996,630 * 2/1991 Liguori et al. ..................... 361/803

* cited by examiner

Primary Examiner—Dean A. Reichard
Assistant Examiner—Hung V Ngo
(74) Attorney, Agent, or Firm—Bernard L. Kleinke; Foley & Lardner

(57) ABSTRACT

A radio frequency component and a method of making it relates to a radio frequency component, which includes a carrier member having an electronic device connected electrically a pair of lead attachment members on the upper surface thereof and having on its underside surface an annular perimeter ground trace conductor portion disposed adjacent to the carrier peripheral edge portion and extending between each lead attachment member and the carrier peripheral edge. A cup shaped lid having a hollow interior and a rim for engaging electrically the annular ground tract conductor portion to seal over an environmentally protected space including the electronic device to protect against unwanted environmental pollutant encroachment. Plug members are disposed in plated through holes extending through the carrier for further sealing off the protected space.

4 Claims, 1 Drawing Sheet

RADIO FREQUENCY COMPONENT AND METHOD OF MAKING SAME

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A "MICROFICHE APPENDIX"

Not Applicable

BACKGROUND OF THE INVENTION

1. Technical Field

The present invention relates in general to an improved radio frequency component and a method of making it. The invention more particularly relates to a radio frequency component, which is environmentally protected and which is thus more reliable and dependable in its operation.

2. Background Art

There have been many different types and kinds of surface mounted radio frequency components which interact with signals having frequencies between approximately one kilohertz and approximately 26 gigahertz. Such radio frequency components require the use of circuit boards having a number of traces thereon to cooperate with components having electronic devices on a carrier. A pair of input/output pads or contact areas located on the underside of the surface of the carrier member are connected to the electronic devices to provide an external connection point to the circuit board traces by suitable techniques such as soldering.

In order to facilitate the arrangement of the radio frequency components on the circuit board in a more compact manner, a method and device shown in U.S. Pat. No. 5,444,187 was invented to facilitate the closely spaced surface mounting of the components on the circuit board. The U.S. Pat. No. 5,444,187 is incorporated herein by reference. Such a technique reduced greatly the need for customizing the radio frequency components and increased the component density on the circuit board. Additionally, the circuit board layout design requirements were greatly simplified.

As disclosed in U.S. Pat. No. 5,444,187, the method briefly relates to the use of radio frequency components having input/output contact points or areas at corners of the underside of the component. This arrangement permits the component to be positioned relative to a pair of circuit board traces for enabling an electrical connection thereto in a range of angular dispositions, thereby facilitating greatly the increase of component density and enabled greater freedom in arranging advantageously the components on the circuit board without requiring expensive customization of the components.

While such a patented technique has proven to be highly successful, there still remains the draw back associated with all surface mounted radio frequency components relating to inherent unreliability due to moisture encroachment and RF shielding (prevention of RF interference with other adjacent components. In this regard, radio frequency components including electronic devices such as filters are adversely affected by moisture caused by condensation from temperature variations, or from the use of the radio frequency component in outside environments. Also, moisture encroachment can be caused by spraying solutions such as cleaning agents, solvents or conformal coatings onto the carrier.

Such unwanted moisture encroachment can cause short circuiting or other undesirable affects such as de-tuning a filter device. Additionally, other components such as capacitors and inductors do not perform satisfactorily when wet. Additionally, other environmental problems such as dust particles or the like infiltrating the surface mounted radio frequency component can cause undesirable and unwanted affects as well. Therefore, it would be highly desirable to have a new and improved radio frequency component, which performs more satisfactorily and reliably and is protected against unwanted environmental problems.

SUMMARY OF THE INVENTION

Therefore, the principal object of the present invention is to provide a new and improved radio frequency component and a method of making it, wherein the inventive radio frequency component is more highly reliable and dependable.

Another object of the present intention is to provide such a new and improved radio frequency component and method of making it, wherein the inventive radio frequency component is protected against undesirable and unwanted environmental pollutants and RF shielding.

Briefly, the above and further objects of the present invention are realized by providing a new and improved radio frequency component and a method of making it to enhance its reliable and efficient operation.

A radio frequency component and a method of making it relates to a radio frequency component, which includes a carrier member having an electronic device connected electrically a pair of lead attachment members on the upper surface thereof and having on its underside surface an annular perimeter ground trace conductor portion disposed adjacent to the carrier peripheral edge portion and extending between each lead attachment member and the carrier peripheral edge. A cup shaped lid having a hollow interior and a rim for engaging electrically the annular ground tract conductor portion to seal over an environmentally protected space including the electronic device to protect against unwanted environmental pollutant encroachment. Plug members are disposed in plated through holes extending through the carrier for further sealing off the protected space.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein.

BEST MODE FOR CARRYING OUT THE INVENTION

Figure 1:
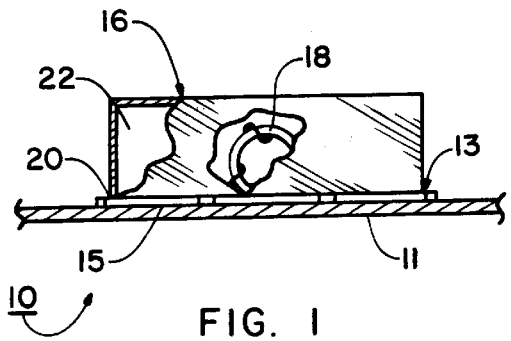
FIG. 1 is a partially broken away elevational view of a radio frequency component, which is constructed in accordance with the present invention, and which is illustrated being mounted to a circuit board.
Figure 2:
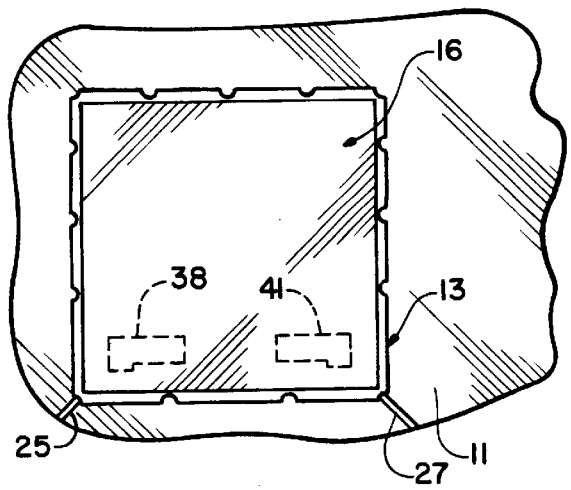
FIG. 2 is a top plan view of the component of FIG. 1.
Figure 3:
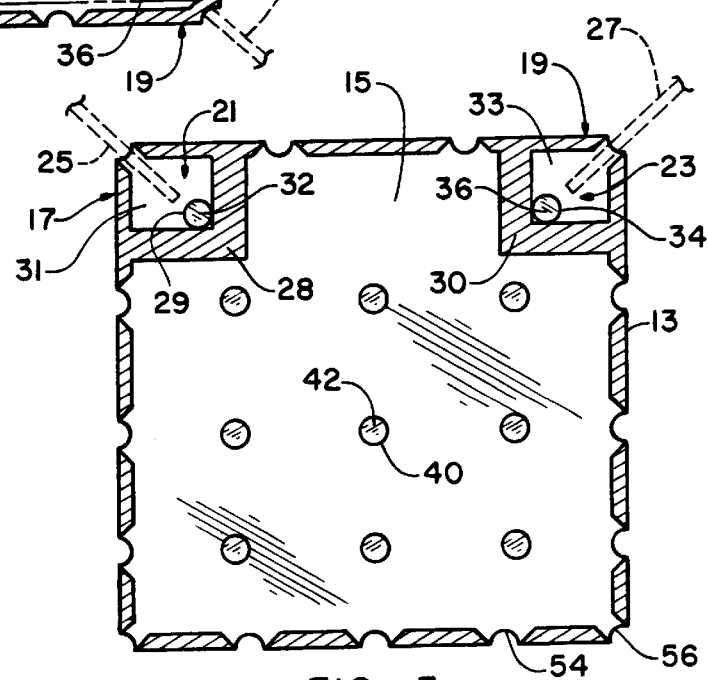
FIG. 3 is an enlarged plan view of the underside of the component of FIG. 1.

Referring now to FIGS. 1 and 2 of the drawings, there is shown a radio frequency component 10, which is constructed in accordance with the present invention. The component 10 is adapted to be connected to a circuit board 11 and includes a rectangular carrier or board member 13 having an upper surface 14 (FIG. 4) and an underside surface 15 (FIG. 3). An electronic device 18 (FIG. 1), such as a filter, is electrically attached to the upper surface 14, and is covered over by an inverted environmentally protective cup-shaped housing or lid 16. As shown in FIG. 1, the lid 16 has a hollow interior 22 (FIG. 1) and a rim 20. In accordance with the present invention, the hollow interior 22 defines an environmentally protected space to protect against unwanted environmental pollutant encroachment so that the electronic device 18 can function properly without undesirable affects caused by the presence of moisture, dust or other intrusive substances and RF shielding.

The carrier member 13 has four corners including the adjacent corners 17 and 19. A pair of input/output connection members 21 and 23 (FIG. 3) are disposed on the carrier underside surface 15 at the respective corners 17 and 19 for connecting electrically with a pair of respective traces 25 and 27 on the circuit board 11. A pair of L-shaped non-conductive gaps 28 and 30 (FIG. 3) help define with the respective corner peripheral edges of the carrier member a pair of conductor pads 31 and 33 for electrical connection to the respective carrier traces 25 and 27.

With the input/output connection members 21 and 23 disposed at the respective adjacent corners 17 and 19 the respective traces 25 and 27 extend at an angle between 90° and 180° to facilitate interconnection with other components (not shown) on the circuit board 11. It will become apparent to those skilled in the art that the arrangement of the input/output connection members can be located in accordance with the teachings of the foregoing mentioned U.S. Pat. No. 5,444,187. In general, the input/output connection members can facilitate connecting to carrier traces between about 90° and about 180° as disclosed in U.S. Pat. No. 5,444,187.

The input/output connection members 21 and 23 include respective plated through holes 29 and 34 (FIGS. 3 and 4), which interconnect electrically the respective conductor pads 31 and 33 with a pair of lead attachment members 38 and 41 disposed at the upper surface at the respective corners 17 and 19. In order to further seal the environmentally protected space, plugs 32 and 36 in the form of solder are disposed in the respective plated through holes 29 and 34. Other plated through holes such as the hole 40 in the carrier member 13 are also filled with solder such as the plug 42 consisting of solder material. In this manner, the entire environmentally protected space is sealed in a moisture and dust tight manner as well as RF shielding. Other materials such as adhesives may be used in addition to the solder, or in place thereof.

Figure 4:
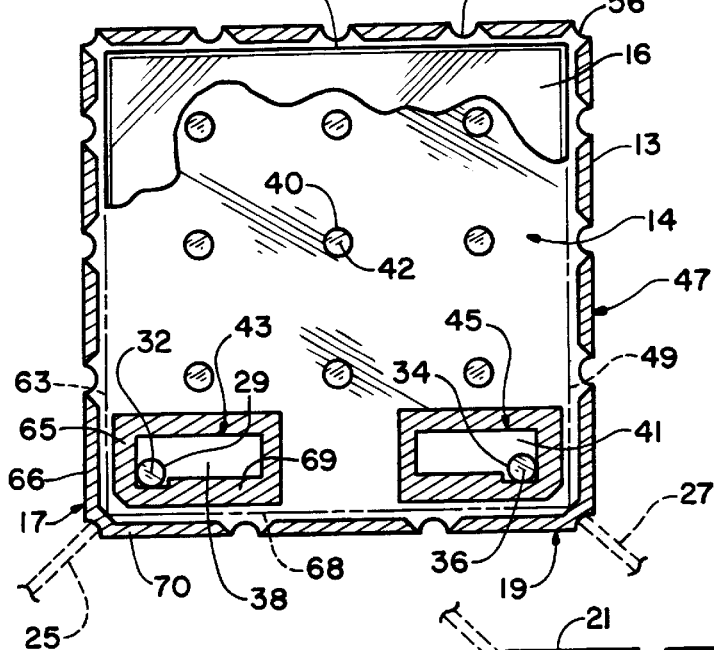
FIG. 4 is a partially broken away enlarged plan view of the drive of FIG. 1, and is similar to the plan view of FIG. 2.

The lead attachment members 38 and 41 on the upper surface 14 of the carrier member 13 are defined by a pair of respective annular non-conductive gaps 43 and 45. An annular perimeter ground trace conductor portion 49 on the upper surface 14 of the carrier 13 is disposed adjacent to a peripheral edge portion generally indicated at 47 of the carrier member 13 for receiving the rim 20 of the lid 16. In this regard, the inverted lid 16 is positioned with its rim 20 in engagement with the annular perimeter ground trace conductor portion 49, and then the rim 20 is soldered to the annual conductor portion 49 to seal the lid 16 to the carrier member 13 with an annular solder bead 52 (FIG. 4). A series of spaced-apart semi-circular notches 54 are disposed between the four corners of the carrier member 13, and a set of four quarter-radius notches such as the notch 56 are disposed at the corners of the carrier member 13.

Considering now the annular ground trace conductor portion 49 in greater detail with reference to FIG. 4, the annualar conductor portion 49 is disposed on the upper surface 14 of the carrier member 13 extending between each one of the lead attachment members 38 and 41 and the carrier peripheral edge 47. In this regard, the annular perimeter ground trace conductor portion 49 includes a portion 63 extending between a portion 65 of the annular non-conductive gap 43 and a peripheral edge portion 66 of the peripheral edge 47. Similarly, the annular perimeter ground trace conductor portion 49 includes a portion 68 extending between a portion 69 of the annular non-conductive gap 43 and a peripheral edge portion 70 of the rectangular non-conductive peripheral edge 47.

Considering now the lid 16 in greater detail with reference to FIGS. 1 and 2, the lid 16 is generally rectangular in shape and is in the form of an inverted open top box composed of conductive material. The lid 16 is non-porous and solid to provide a moisture tight protective environment for the components disposed within the protected space and RF shield.

In order to make the radio frequency component 10, the rim 20 of the lid 16 is positioned in engagement with the annular perimeter ground trace conductor portion 49 on the carrier member upper surface 14. The rim 20 is then soldered to the annular ground trace conductor portion 49 to seal over the environmentally protected space including substantially the entire upper surface of the carrier member 13 to protect against unwanted environmental pollutant encroachment. The plated through holes in the carrier member 13 are then filled with plugs in the form of solder to further seal the protected space. As a result, moisture and RF interference is prevented from entering the and/or radiating from protected space, but electrical continuity is maintained between the upper surface 14 and the underside surface 15 of the carrier member 13.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A radio frequency component for facilitating the mounting thereof on a circuit board having al least a pair of traces, comprising:

a carrier member having a peripheral edge and including an upper surface and an underside surface;

a pair of input/output connection members disposed on the underside surface for enabling the electrical connection of said carrier member and to the circuit board traces;

said input/output connection members having a pair of means defining plated through holes extending between the upper and underside surfaces;

a pair of lead attachment members connected electrically on the upper side to the respective means defining plated through holes;

an electronic device connected electrically to said lead attachment members;

an annular perimeter ground trace conductor portion disposed on said upper surface extending between each one of said lead attachment members and the carrier peripheral edge;

a cup shaped lid having a hollow interior and a rim for engaging electrically said annular trace conductor portion to seal over an environmentally protected space including a substantial portion of said upper surface and said electronic device to protect against unwanted environmental pollutant encroachment; and plug means disposed in the pair of said means defining plated through holes for further sealing said protected space;

wherein said carrier member is rectangular having four corners, and said pair of input/output connection members are respectively disposed at two of the carrier's corners; and wherein each of said input/output connection members includes an L-shaped nonconductive gap defining with a respective adjacent corner peripheral edge of the carrier member a conductor pad.

2. The radio frequency component of claim 1 wherein the lid's rim is soldered to the perimeter trace conductor portion of the upper surface.

3. A radio frequency component according to claim 1, wherein said lid is generally rectangular in configuration and covers over substantially the entire upper surface of said carrier member.

4. A radio frequency component according to claim 1, wherein said plug means comprise solder.

* * * * *